US009762193B2

(12) United States Patent
Namba et al.

(10) Patent No.: US 9,762,193 B2
(45) Date of Patent: Sep. 12, 2017

(54) SOUND PROCESSING APPARATUS, SOUND PROCESSING METHOD AND PROGRAM

(71) Applicant: Sony Corporation, Tokyo (JP)

(72) Inventors: Ryuichi Namba, Tokyo (JP); Mototsugu Abe, Kanagawa (JP); Akira Inoue, Tokyo (JP); Keisuke Toyama, Kanagawa (JP); Shusuke Takahashi, Chiba (JP); Masayuki Nishiguchi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 486 days.

(21) Appl. No.: 13/788,488

(22) Filed: Mar. 7, 2013

(65) Prior Publication Data

US 2013/0182857 A1 Jul. 18, 2013

Related U.S. Application Data

(62) Division of application No. 12/069,844, filed on Feb. 13, 2008, now Pat. No. 8,422,695.

(30) Foreign Application Priority Data

Feb. 15, 2007 (JP) .................................. 2007-035410

(51) Int. Cl.
*H03G 1/00* (2006.01)
*G11B 27/034* (2006.01)
(Continued)

(52) U.S. Cl.
CPC ............. *H03G 1/00* (2013.01); *G11B 27/034* (2013.01); *H04N 5/772* (2013.01); *H04R 3/005* (2013.01);
(Continued)

(58) Field of Classification Search
CPC ...... H04R 3/005; H04R 2499/11; H04R 1/32; H04R 1/40; H04R 2201/401;
(Continued)

(56) References Cited

U.S. PATENT DOCUMENTS 5,995,706 A   11/1999   Iijima et al.
6,757,397 B1 *  6/2004   Buecher et al. .............. 381/122
(Continued)

FOREIGN PATENT DOCUMENTS

JP   63-152277    6/1988
JP   05-056007 A  3/1993
(Continued)

OTHER PUBLICATIONS

Yilmaz, Özgür et al., "Blind Separation of Speech Mixtures via Time-Frequency Masking", *IEEE Transactions on Signal Processing*, vol. 52, No. 7, Jul. 2004, pp. 1830-1847.
(Continued)

*Primary Examiner* — Davetta W Goins
*Assistant Examiner* — Daniel Sellers
(74) *Attorney, Agent, or Firm* — Chip Law Group

(57) ABSTRACT

A sound processing apparatus includes a sound determination portion operable to determine whether an input sound includes a first sound emitted from a particular source based on location information of the source, a sound separation portion operable to separate the input sound into the first sound and a second sound emitted from a source different from the particular source if the sound determination portion determines that the input sound includes the first sound, and a sound mixing portion operable to mix the first sound and the second sound separated by the sound separation portion at a prescribed volume ratio.

19 Claims, 13 Drawing Sheets

(51) Int. Cl.
*H04N 5/77* (2006.01)
*H04R 3/00* (2006.01)
*G10L 21/0208* (2013.01)
*H04N 5/91* (2006.01)
*H04N 9/806* (2006.01)

(52) U.S. Cl.
CPC ...... *G10L 2021/02087* (2013.01); *H04N 5/91* (2013.01); *H04N 9/8063* (2013.01); *H04R 2201/401* (2013.01); *H04R 2430/20* (2013.01); *H04S 2400/15* (2013.01)

(58) Field of Classification Search
CPC ........ H04R 2201/403; H04R 2201/405; H04R 2430/20; H04R 2430/21; H04R 2430/23; H04R 2430/25; G10L 2021/02087; H04S 2400/15
USPC ..................................................... 381/57, 92
See application file for complete search history.

(56) References Cited

U.S. PATENT DOCUMENTS

| | | | |
|---|---|---|---|
| 7,123,727 B2* | 10/2006 | Elko et al. ...................... 381/92 |
| 7,269,264 B2 | 9/2007 | Gierse | |
| 7,567,898 B2 | 7/2009 | Bennett | |
| 2006/0013416 A1* | 1/2006 | Truong et al. ................ 381/119 |
| 2006/0053002 A1* | 3/2006 | Visser et al. .................. 704/200 |
| 2007/0009122 A1* | 1/2007 | Hamacher ..................... 381/312 |
| 2007/0147635 A1 | 6/2007 | Dijkstra et al. | |

FOREIGN PATENT DOCUMENTS

| | | |
|---|---|---|
| JP | 05-043200 U | 6/1993 |
| JP | 2001-084713 A | 3/2001 |
| JP | 2002-218583 A | 8/2002 |
| JP | 2004-072306 A | 3/2004 |
| JP | 2005-024736 A | 1/2005 |
| JP | 2005-341073 A | 12/2005 |
| JP | 2006-154314 A | 6/2006 |

OTHER PUBLICATIONS

Mori, Y. et al., "Real-Time Implementations of Two-Stage Blind Source Separation Combining SIMO-ICA and Binary Masking", Nara Institute of Science and Technology, Nara, Japan, and Kobe Steel, Ltd., Kobe, Japan, pp. 229-232.

* cited by examiner

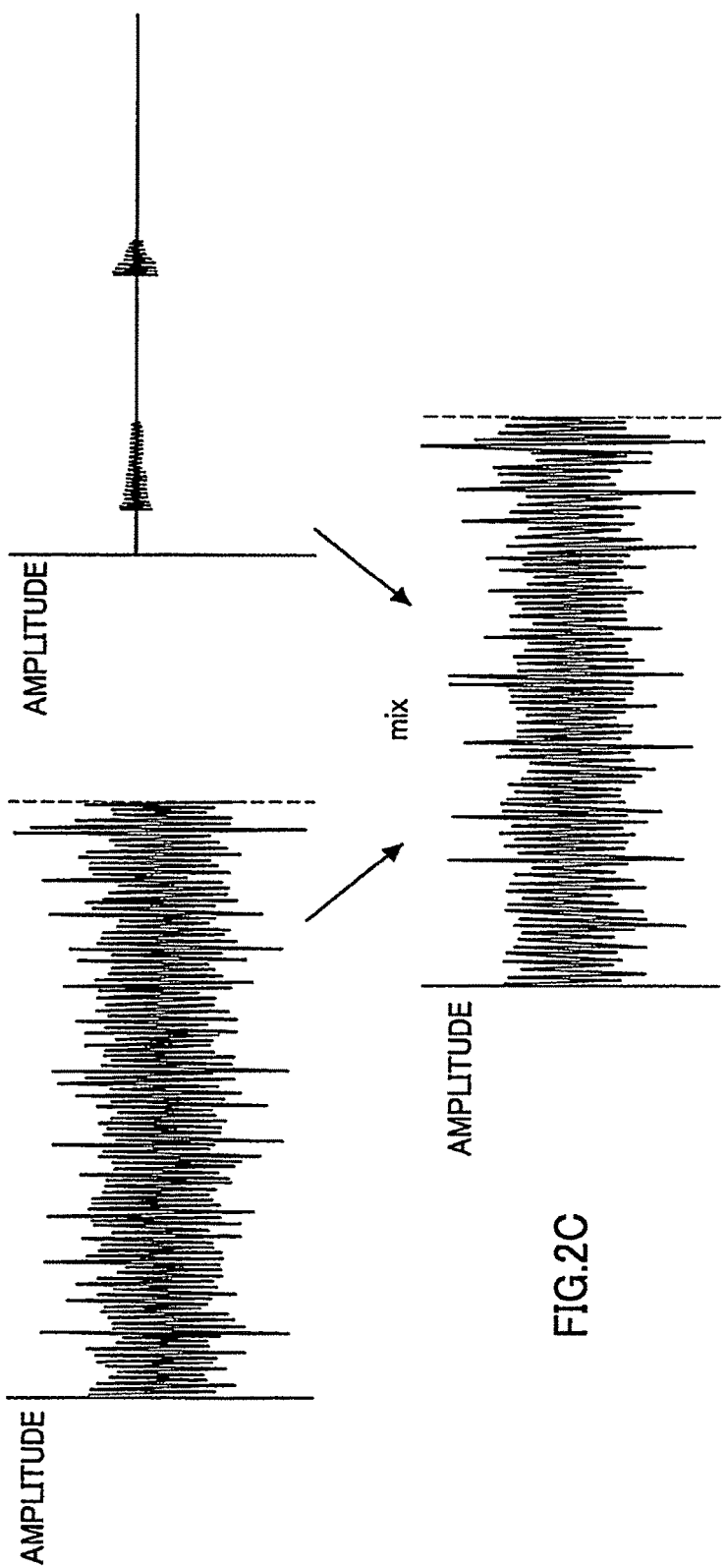
FIG.2A
FIG.2B
FIG.2C

SOUND PROCESSING APPARATUS, SOUND PROCESSING METHOD AND PROGRAM

CROSS REFERENCES TO RELATED APPLICATIONS

The present application claims priority under 35 U.S.C. §120 as a divisional application to U.S. patent application Ser. No. 12/069,844 filed Feb. 13, 2008, entitled "Sound Processing Apparatus, Sound Processing Method and Program," which contains subject matter related to Japanese Patent Application JP 2007-035410 filed in the Japanese Patent Office on Feb. 15, 2007, the entire contents of both of which are incorporated herein by reference.

BACKGROUND OF THE INVENTION

1. Field of the Invention

The present invention relates to a sound processing apparatus, a sound processing method and program.

2. Description of the Related Art

A video/sound recording apparatus that is capable of recoding a video of a subject and a sound that is emitted from the subject is widely available today. An operator of the video/sound recording apparatus can adjust the shooting direction of the video/sound recording apparatus or zoom in or out the image of a subject by manipulating an operating means on the video/sound recording apparatus.

A sound volume decreases with distance from a sound source. Therefore, in the video/sound recording apparatus, a sound that is caused by an operator of the video/sound recording apparatus such as an operator's voice or an operating sound of the operating means can be accidentally recorded at a higher volume than a sound that is emitted from a subject.

Japanese Unexamined Patent Application Publication No. 2005-341073 discloses a sound processing apparatus for recording a sound in which the volume of a sound that is caused by an operator is suppressed. Specifically, the sound processing apparatus includes five directional microphones, ones for the front left, the front right, the rear left and the rear right, and one being detachable. Thus, the voice of an operator who is located at the rear center is not substantially picked up by any of the front-left, front-right, rear-left and rear-right microphones, and it can be picked up by the detachable microphone according to need or purpose.

Japanese Unexamined Patent Application Publication No. 2006-154314 discloses a technique of separating a signal from one or more sources in a mixed sound that includes sounds from a plurality of sources with the use of BSS (Blind Source Separation) based on ICA (Independent Component Analysis).

SUMMARY OF THE INVENTION

However, the video/sound recording apparatus in related art needs to include a large number of microphones, which leads to a large hardware size. Further, the video/sound recording apparatus in related art selects a sound of an operator using the directivity of microphones, which places a constraint on the location of the operator.

In light of the foregoing, there is a need for a new, improved sound processing apparatus, a sound processing method and program which are capable of recording a sound by adjusting the volume ratio of a sound emitted from a particular source to a whole sound.

According to an embodiment of the present invention, there is provided a sound processing apparatus that includes a sound determination portion operable to determine whether an input sound includes a first sound emitted from a particular source based on location information of a source, a sound separation portion operable to separate the input sound into the first sound and a second sound emitted from a source different from the particular source if the sound determination portion determines that the input sound includes the first sound, and a sound mixing portion operable to mix the first sound and the second sound separated by the sound separation portion at a prescribed volume ratio.

In this configuration, the sound separation portion separates the first sound that is emitted from a particular source and included in the input sound, the sound mixing portion mixes the first sound and the second sound which is another sound included in the input sound in such a way that a volume ratio of the first sound is lower than a volume ratio of the first sound in the input sound. Thus, if a volume of the first sound that is emitted from a particular source is undesirably high in the input sound, the sound mixing portion can generate a mixed sound in which a volume ratio of the second sound is higher than a volume ratio of the second sound in the input sound. The sound processing apparatus can thereby prevent the second sound from being improperly buried in the first sound.

Further, the sound mixing portion may mix the first sound that is emitted from the vicinity and the second sound which is another sound included in the input sound in such a way that a volume ratio of the first sound is higher than a volume ratio of the first sound in the input sound. In this configuration, it is possible to enhance the first sound that is emitted from a person who picks up a sound when it is desired to pick up a sound from the person who picks up a sound. If the sound determination portion determines that the input sound does not include the first sound, the sound separation portion may not separate the input sound.

The particular source may be located within a set distance from a pickup location of the input sound. In other words, the first sound may be emitted from a location within a set distance from a pickup location of the input sound. Because a sound volume decreases with distance from a sound source, a sound that is emitted from a source that is in close proximity to the pickup location is likely to be picked up at a higher volume as the input sound. Accordingly, the sound mixing portion can suppress a volume ratio of the first sound in close proximity to the pickup location of the input sound and correct an unbalanced relationship in volume due to a difference in distance between the pickup location and sound sources.

The first sound may include a sound caused by an operator of an apparatus that is used when picking up the input sound, and the second sound may include a sound that is emitted from a pickup target. In this configuration, it is possible to suppress a volume ratio of the first sound that is emitted from an operator who manipulates an apparatus in close proximity to the apparatus that is used when picking up the input sound and prevent the second sound that is emitted from the pickup target from being improperly buried in the first sound.

The sound determination portion may determine whether the input sound includes the first sound based on at least one of a volume and a quality of the input sound. The sound determination portion may estimate location information of a source of the input sound or location information of a source of each sound emitted from one or a plurality of sources included in the input sound based on a volume or a phase of the input sound.

The sound processing apparatus may further include a shooting portion operable to shoot a video, and the sound determination portion may include a location information calculation portion operable to calculate location information of a source based on at least one of a volume and a phase of a sound emitted from one or a plurality of sources included in an input sound, and determine that the input sound includes the first sound emitted from a particular source if the location information calculation portion calculates that a location of a source of the input sound is rearward of a shooting direction of the shooting portion and the input sound matches or is close to a human sound. An operator often manipulates the sound processing apparatus from the rear of the shooting direction of the shooting portion. Therefore, the sound determination portion can determine that the input sound dominantly includes an operator's sound as the first sound if a source location of the input sound is in the rear of the shooting direction of the shooting portion and the input sound matches or is close to a human voice. It is thereby possible to obtain a mixed sound in which a volume ratio of the operator's sound is reduced by the sound mixing portion.

The sound determination portion may determine that the input sound includes the first sound emitted from a particular source if a location of a source of the input sound is within a set distance from a pickup position, the input sound includes an impulse sound, and the input sound has a higher volume than a past average volume. When an operator of an apparatus that picks up an input sound manipulates a button of the apparatus or changes the way of hand-holding the apparatus, an impulse sound such as snap or bang is likely to occur. Further, because such an impulse sound is generated in the apparatus, it is likely to be picked up at a relatively high volume. Therefore, the sound determination portion can determine that the input sound dominantly includes a noise caused by the action of an operator as the first sound if the source location of the input sound is within a set distance from the sound pickup location, the input sound includes an impulse sound, and the input sound has a higher volume than a past average volume. It is thereby possible to obtain a mixed sound in which a volume ratio of a noise due to the action of an operator is reduced by the sound mixing portion.

The sound processing apparatus may include a plurality of pickup portions operable to pick up the input sound, and a recording portion operable to record a mixed sound mixed by the sound mixing portion into a memory. In this configuration, the recording portion records the mixed sound with the volume ratio of the first sound being lower than the volume ratio of the first sound in the input sound into the memory. This allows a playback apparatus to play back the mixed sound in which the volume ratio of the first sound is adjusted appropriately without the need for installing a special volume correcting function to the playback apparatus.

The sound processing apparatus may include a memory operable to store the input sound, and a reproduction portion operable to reproduce the input sound stored in the memory and output the input sound to at least one of a location information calculation portion, the sound determination portion and the sound separation portion. In this configuration, the location information calculation portion, the sound determination portion and the sound separation portion generate the mixed sound based on the input sound that is input from the reproduction portion and output the mixed sound as the reproduced sound. This enables the playback of the mixed sound in which the volume ratio of the first sound is adjusted appropriately without the need for installing a special volume correcting function to a recording apparatus which records the input sound to the memory.

The sound processing apparatus may include a volume correction portion operable to reversely correct a volume of the second sound separated by the sound separation portion according to a degree of correction if correction is made on a volume of the input sound. For example, if the volume of the input sound is suppressed as a whole due to an excessive volume of the first sound, the volume of the second sound is also suppressed accordingly. The volume correction portion can increase the volume of the second sound according to the degree of suppressing the input sound volume, thereby preventing the second sound from being too small.

According to another embodiment of the present invention, there is provided a sound processing apparatus that includes a sound separation portion operable to separate an input sound, a sound determination portion operable to determine whether a sound separated by the sound separation portion includes a first sound emitted from a particular source, and a sound mixing portion operable to mix the first sound and a second sound emitted from a source different from the particular source separated by the sound separation portion at a prescribed mixing ratio.

According to another embodiment of the present invention, there is provided a program for causing a computer to serve as a sound processing apparatus that includes a sound determination portion operable to determine whether an input sound includes a first sound emitted from a particular source based on location information of a source, a sound separation portion operable to separate the input sound into the first sound and a second sound emitted from a source different from the particular source if the sound determination portion determines that the input sound includes the first sound, and a sound mixing portion operable to mix the first sound and the second sound separated by the sound separation portion at a prescribed volume ratio.

The above program can cause a hardware resource of a computer including CPU, ROM, RAM or the like to execute the function of the location information calculation portion, the sound determination portion and the sound separation portion. It is therefore possible to cause a computer that implements the program to serve as the above-described sound processing apparatus.

The sound determination portion may determine whether the input sound includes the first sound based on at least one of location information of a source, a volume and a quality of the input sound.

The program may further include a shooting portion operable to shoot a video, and the sound determination portion may include a location information calculation portion operable to calculate location information of a source based on at least one of a volume and a phase of a sound emitted from one or a plurality of sources included in an input sound, and determine that the input sound includes the first sound emitted from a particular source if the location information calculation portion calculates that a location of a source of the input sound is rearward of a shooting direction of the shooting portion and the input sound matches or is close to a human sound.

The sound determination portion may determine that the input sound includes the first sound emitted from a particular source if a location of a source of the input sound is within a set distance from a pickup position, the input sound includes an impulse sound, and the input sound has a higher volume than a past average volume.

According to another embodiment of the present invention, there is provided a sound processing method including the steps of determining whether an input sound includes a first sound emitted from a particular source based on source location information, separating the input sound into the first sound and a second sound emitted from a source different from the particular source if it is determined that the input sound includes the first sound, and mixing the first sound and the second sound separated from each other at a prescribed volume ratio.

According to the embodiments of the present invention described above, it is possible to output or record a sound after appropriately adjusting a volume ratio of a sound that is emitted from a particular source to the entire sound.

BRIEF DESCRIPTION OF THE DRAWINGS

FIGS. 2A-2C are illustrations showing the amplitude of a time domain of a sound that is recorded by a general sound recording method.

DETAILED DESCRIPTION OF THE PREFERRED EMBODIMENTS

Figure 1:
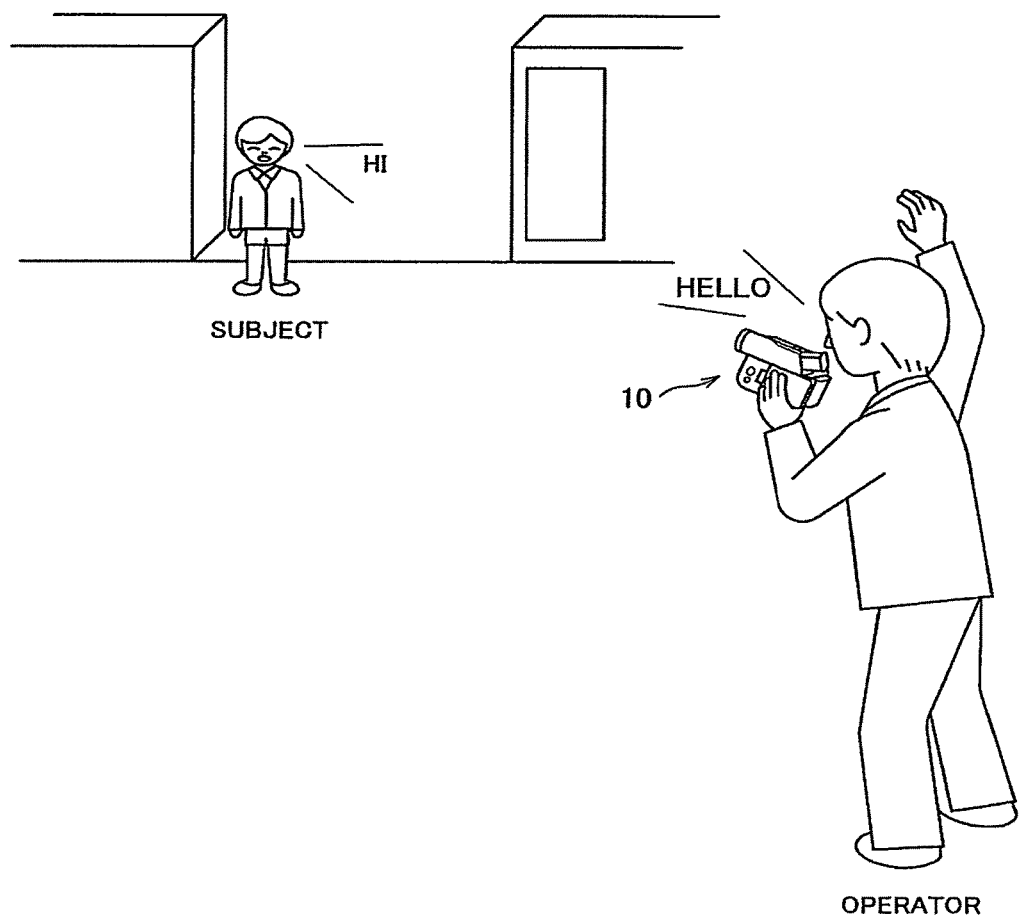
FIG. 1 is an illustration showing an example of a scene where a sound recording apparatus according to a first embodiment of the present invention is used.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

(First Embodiment)

A sound recording apparatus 10 according to a first embodiment of the present invention is described hereinafter. In this embodiment, an exemplary scene where the sound recording apparatus 10 is used is described with reference to FIGS. 1 and 2, and then the configuration and the operation of the sound recording apparatus 10 are described with reference to FIGS. 3 to 10.

FIG. 1 is an illustration showing an example of the scene where the sound recording apparatus 10 of this embodiment is used. In the example of FIG. 1, a child as a subject is standing in front of a school, and an operator who holds the sound recording apparatus 10 having a video shooting function with his hand aims the sound recording apparatus 10 at the subject.

The subject answers "hi" in response to the operator's call "hello". The sound recording apparatus 10 which has a video shooting function records the call "hello" from the operator and the answer "hi" from the subject together with the video of the subject. The sound that is recorded by a general sound recording method is described hereinbelow with reference to FIGS. 2A-2C.

FIGS. 2A-2C are illustrations showing the amplitude of the time domain of the sound that is recorded by a general sound recording method. If a sound source is assumed to be a point source, the volume of a sound that is picked up is inversely proportional to the square of a distance between a sound source and a sound pickup location. Thus, the volume of the picked-up sound decreases as the pickup location is distant from the source. Therefore, the call "hello" from the operator who is close to the pickup location is picked up as a sound which has the amplitude as shown in FIG. 2A.

On the other hand, the answer "hi" from the subject who is farther from the pickup location than the operator is picked up as a sound which has the smaller amplitude than the operator's voice as shown in FIG. 2B. In this case, the general sound recording method records a sound in which the operator's call "hello" and the subject's answer "hi" are simply superposed on one another as shown in FIG. 2C.

However, in the sound shown in FIG. 2C, the operator's call "hello" is so dominant that the subject's answer "hi" is improperly buried therein. Further, an operating noise due to the operator is recorded at a relatively larger level than the sound from the subject. Accordingly, the sound that is emitted from the subject is masked by the sound that is caused by the operator, and therefore it often fails to record the sound from the subject with an appropriate sound volume balance that is intended by the operator.

In light of the above issue, the sound recording apparatus 10 according to this embodiment has been invented. The sound recording apparatus 10 of this embodiment suppresses the volume ratio of a sound that is caused by an operator and records a sound from a subject and a sound caused by an operator with an appropriate volume balance. The configuration and the operation of the sound recording apparatus 10 are described hereinbelow in detail.

Figure 3:
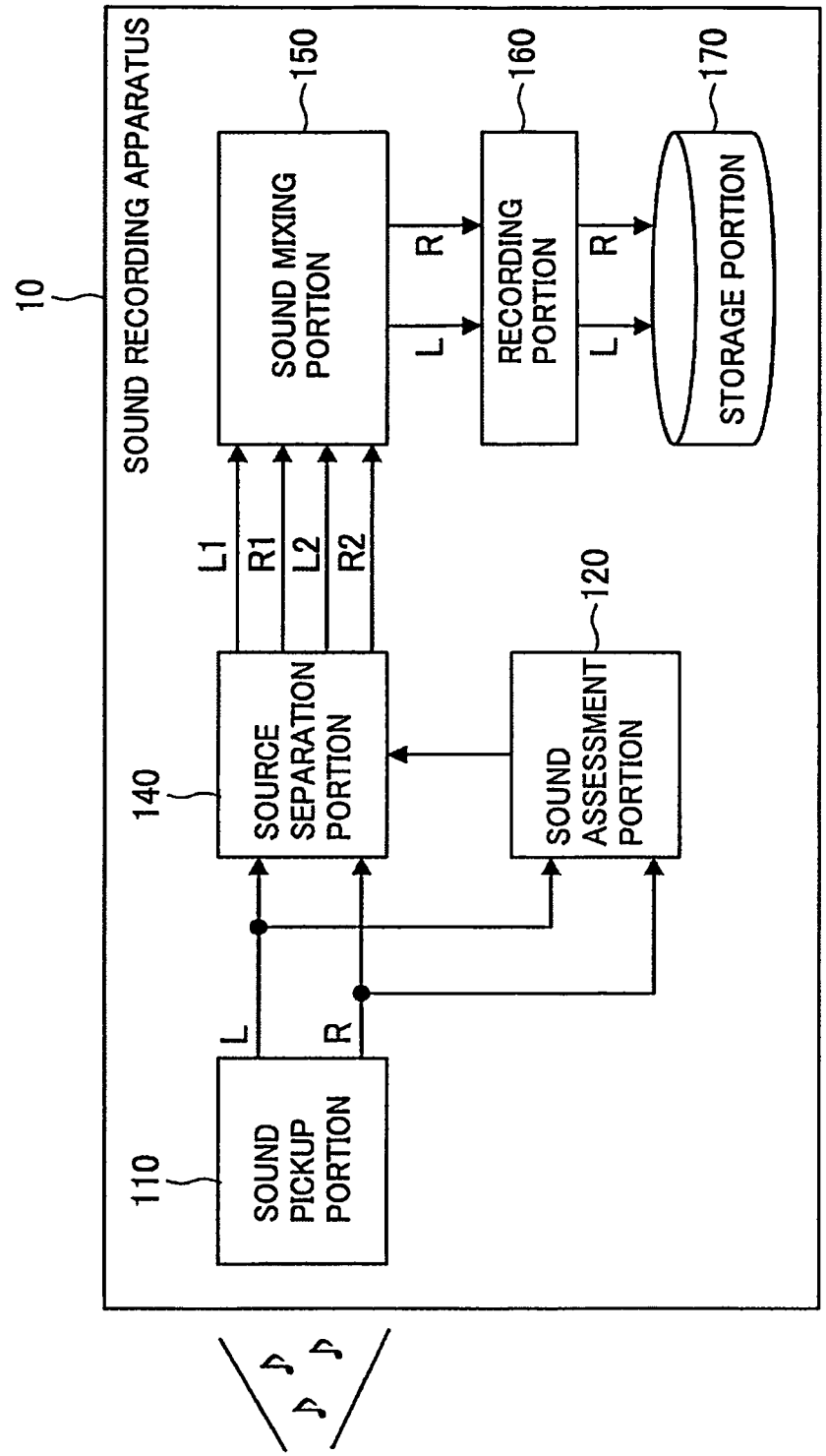
FIG. 3 is a functional block diagram showing the configuration of a sound recording apparatus as an example of a sound processing apparatus according to the first embodiment of the present invention.

FIG. 3 is a functional block diagram showing the configuration of the sound recording apparatus 10 as an example of a sound processing apparatus according to this embodiment. The sound recording apparatus 10 includes a sound pickup portion 110, a sound determination portion 120, a source separation portion 140, a sound mixing portion 150, a recording portion 160 and a storage portion 170. Although FIG. 1 illustrates a video camera as an example of the sound recording apparatus 10, the sound recording apparatus 10 is not limited to a video camera, and it may be information processing apparatus such as a PC (Personal Computer), a mobile phone, a PHS (Personal Handyphone System), a portable sound processing apparatus, a portable video processing apparatus, a PDA (Personal Digital Assistant), a home game device and a portable game device.

The sound pickup portion 110 picks up a sound and performs discrete quantization of the picked-up sound. The sound pickup portion 110 includes two or more pickup portions (e.g. microphones) which are physically separated from each other. In the example of FIG. 3, the sound pickup portion 110 includes two pickup portions, one for picking up a left sound L and one for picking up a right sound R. The sound pickup portion 110 outputs the discrete-quantized left sound L and right sound R as an input sound to the sound determination portion 120 and the source separation portion 140.

The sound determination portion 120 determines whether the input sound from the sound pickup portion 110 includes a proximity sound (first sound) that is emitted from the vicinity of the sound recording apparatus 10, such as the voice of an operator or a noise caused by the action of the operator. The detailed configuration of the sound determination portion 120 is described hereinafter with reference to FIG. 4.

Figure 4:
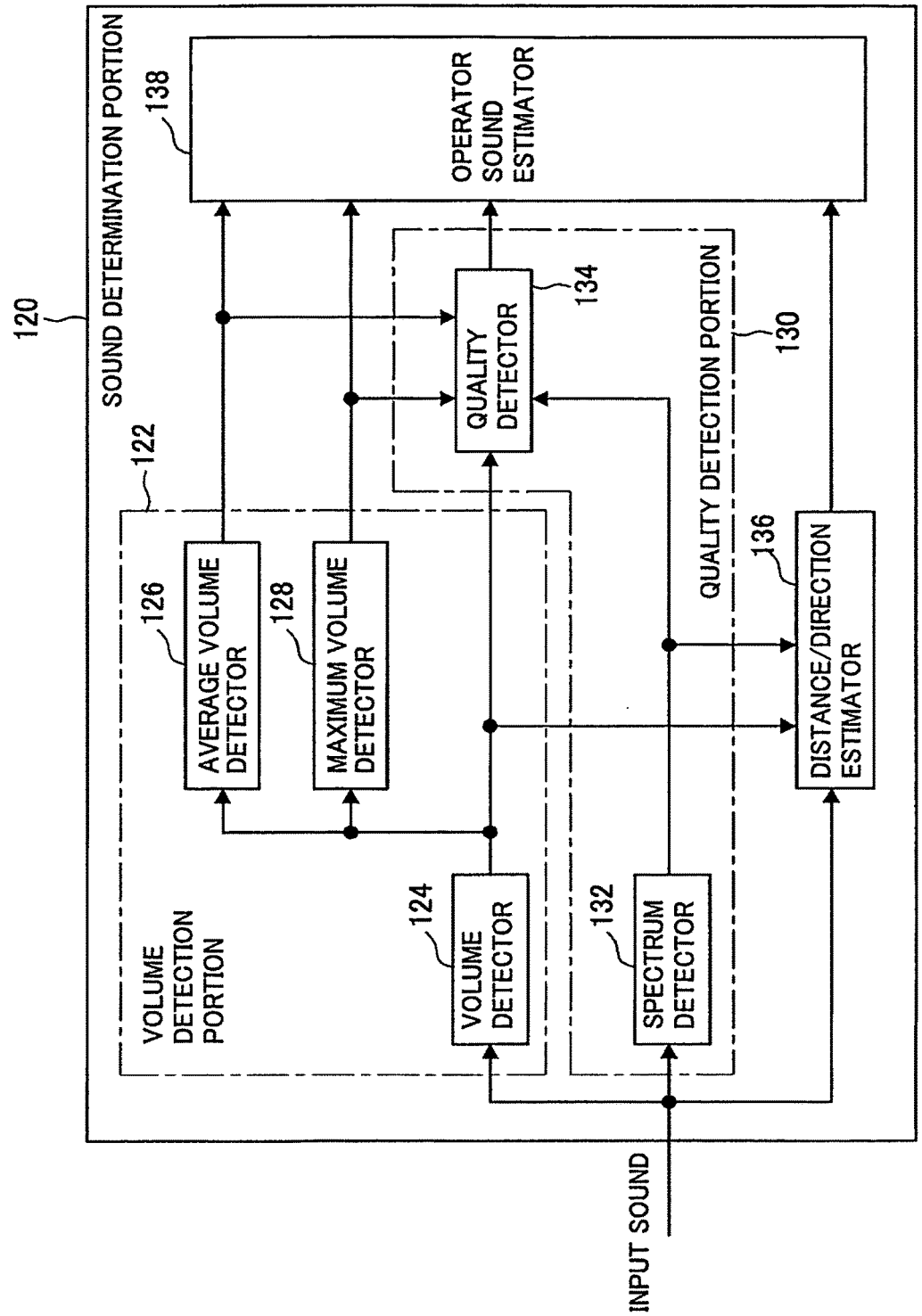
FIG. 4 is a functional block diagram showing the configuration of a sound determination portion.

FIG. 4 is a functional block diagram showing the configuration of the sound determination portion 120. The sound determination portion 120 includes a volume detection portion 122 that has a volume detector 124, an average volume detector 126 and a maximum volume detector 128, a quality detection portion 130 that has a spectrum detector 132 and a quality detector 134, a distance/direction estimator 136, and an operator sound estimator 138. In FIG. 4, the left sound L and the right sound R are collectively shown as an input sound in order to clarify the drawing.

The volume detector 124 detects the volume string (amplitude) of an input sound which is given in each prescribed frame period (e.g. several tens of microseconds) and outputs the detected volume string of the input sound to the average volume detector 126, the maximum volume detector 128, the quality detector 134, and the distance/direction estimator 136.

The average volume detector 126 detects a volume average of the input sound per frame, for example, based on the volume string of each frame which is input from the volume detector 124. The average volume detector 126 then outputs the detected volume average to the quality detector 134 and the operator sound estimator 138.

The maximum volume detector 128 detects a volume maximum value of the input sound per frame, for example, based on the volume string of each frame which is input from the volume detector 124. The maximum volume detector 128 then outputs the detected volume maximum value to the quality detector 134 and the operator sound estimator 138.

The spectrum detector 132 detects each spectrum in the frequency domain of an input sound by performing FFT (Fast Fourier Transform), for example, on the input sound. The spectrum detector 132 then outputs the detected spectrum to the quality detector 134 and the distance/direction estimator 136.

The quality detector 134 receives the input sound, the volume average, the volume maximum value and the spectrum, detects likelihood of being a human voice, likelihood of being music, stationarity, impulsiveness and so on regarding the input sound based on those inputs, and outputs the results to the operator sound estimator 138. The likelihood of being a human voice may be information that indicates whether a part or whole of an input sound matches a human voice or how close it is to a human voice. The likelihood of being music may be information that indicates whether a part or whole of the input sound is music or how close it is to music.

The stationarity indicates that the statistical properties of a sound do not significantly change with time, such as an air-conditioning sound. The impulsiveness indicates highly noisy properties due to spot energy concentration, such as an impact sound and a plosive sound.

The quality detector 134 may detect the likelihood of being a human voice based on the degree of matching between the spectrum distribution of an input sound and the spectrum distribution of a human voice, for example. Further, the quality detector 134 may compare the volume maximum value of each frame with that of another frame and determine that the impulsiveness is higher as the volume maximum value is larger.

The quality detector 134 may analyze the quality of an input sound using a signal processing technique such as zero crossing or LPC (Linear Predictive Coding) analysis. Because the zero crossing detects a fundamental period of an input sound, the quality detector 134 may detect the likelihood of being a human voice based on whether the detected fundamental period is within a fundamental period of a human voice (e.g. 100 to 200 Hz).

The distance/direction estimator 136 serves as a location information calculation portion that receives the input sound, the volume string of the input sound, the spectrum of the input sound and so on and estimates location information such as direction information and distance information of the source of the input sound or the source of a sound that is dominantly included in the input sound. The distance/direction estimator 136 uses various estimation methods of the location information of a sound source based on the phase, the volume, the volume string, the past average volume and the maximum volume and so on of the input sound in combination, thereby estimating the sound source location comprehensively even when the reverberation or the sound reflection by the main body of the sound recording apparatus 10 affect largely. An example of the method of estimating the direction information and the distance information which is used in the distance/direction estimator 136 is described hereinbelow with reference to FIGS. 5 to 8.

Figure 5:
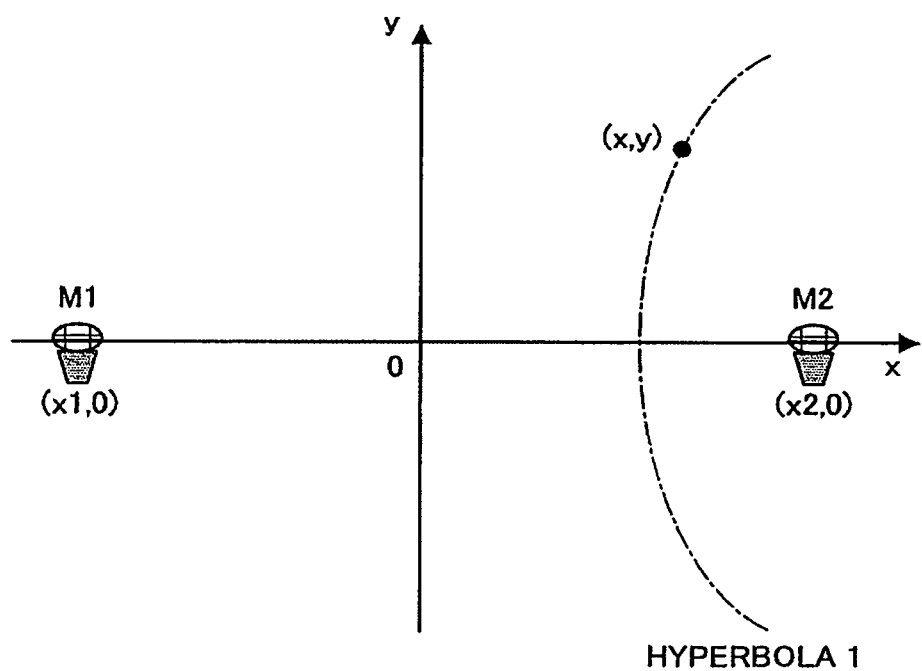
FIG. 5 is an illustration showing the way of estimating a source location of an input sound based on a phase difference between two input sounds.

FIG. 5 is an illustration showing the way of estimating a source location of an input sound based on a phase difference between two input sounds. If a sound source is assumed to be a point source, it is possible to measure the phases of input sounds that respectively reach a microphone M1 and a microphone M2 which constitute the sound pickup portion 110 and a phase difference between the input sounds. Further, using the phase difference and a frequency f and a sound velocity c of the input sound, it is possible to calculate a difference between a distance from the microphone M1 to the source location of the input sound and a distance from the microphone M2 to the source location of the input sound. The sound source exists on the set of points where the difference in distance is constant. The set of such points where the difference in distance is constant is represented by a hyperbola.

For example, it is assumed that the microphone M1 is located at $(x_1, 0)$, and the microphone M2 is located at $(x_2, 0)$ (the generality is maintained with such assumption). If a point on the set of points of a source location to be calculated is $(x, y)$ and the above-mentioned difference in distance is d, the following expression 1 is obtained.

$$\sqrt{(x-x_1)^2+y^2}-\sqrt{(x-x_2)^2+y^2}=d \quad \text{Expression 1}$$

The expression 1 can be expanded into the expression 2, which can be arranged into the expression 3 that represents a hyperbola.

$$\{(x-x_1)^2 + 2y^2 + (x-x_2)^2 - d^2\}^2 = \quad \text{Expression 2}$$
$$4\{(x-x_1)^2 + y^2\}\{(x-x_2)^2 + y^2\}$$

$$\frac{\left(x - \frac{x_1+x_2}{2}\right)^2}{\left(\frac{d}{2}\right)^2} - \frac{y^2}{\left(\frac{1}{2}\right)^2} = 1 \quad \text{Expression 3}$$

The distance/direction estimator 136 can determine to which of the microphone M1 and the microphone M2 the sound source is located in proximity based on a difference in volume between the input sounds that are picked up by the microphone M1 and the microphone M2, respectively. For example, the distance/direction estimator 136 can determine that the sound source exists on the hyperbola 1 which is close to the microphone M2 as shown in FIG. 5.

The frequency f of an input sound which is used for the calculation of a phase difference may need to satisfy the condition that is represented by the following expression 4 with respect to a distance between the microphone M1 and the microphone M2.

$$f < \frac{c}{2d} \quad \text{Expression 4}$$

Figure 6:
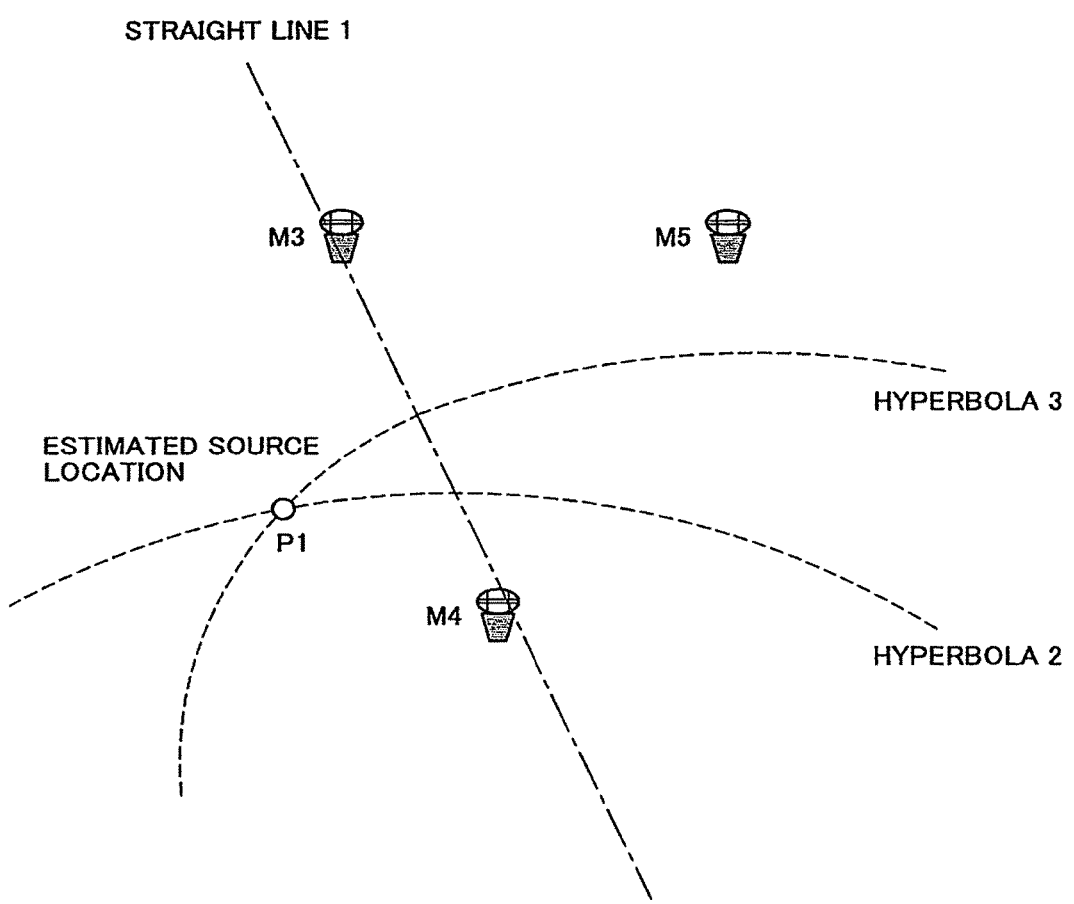
FIG. 6 is an illustration showing the way of estimating a source location of an input sound based on a phase difference among three input sounds.

FIG. 6 is an illustration showing the way of estimating a source location of an input sound based on a phase difference among three input sounds. It is assumed that a microphone M3, a microphone M4 and a microphone M5 which constitute the sound pickup portion 110 are arranged as shown in FIG. 6. If the phase of an input sound that reaches the microphone M5 delays compared with the phases of input sounds that reach the microphone M3 and the microphone M4, the distance/direction estimator 136 determines that the sound source is located on the opposite side of the microphone M5 with respect to the straight line 1 which connects the microphone 3 and the microphone 4 (depth determination).

Further, the distance/direction estimator 136 can calculate a hyperbola 2 on which the sound source possibly exists based on a phase difference between the input sounds that respectively reach the microphone M3 and the microphone M4 and also calculates a hyperbola 3 on which the sound source possibly exists based on a phase difference between the input sounds that respectively reach the microphone M4 and the microphone M5. Consequently, the distance/direction estimator 136 can estimate a point P1 of intersection of the hyperbola 2 and the hyperbola 3 as a source location.

Figure 7:
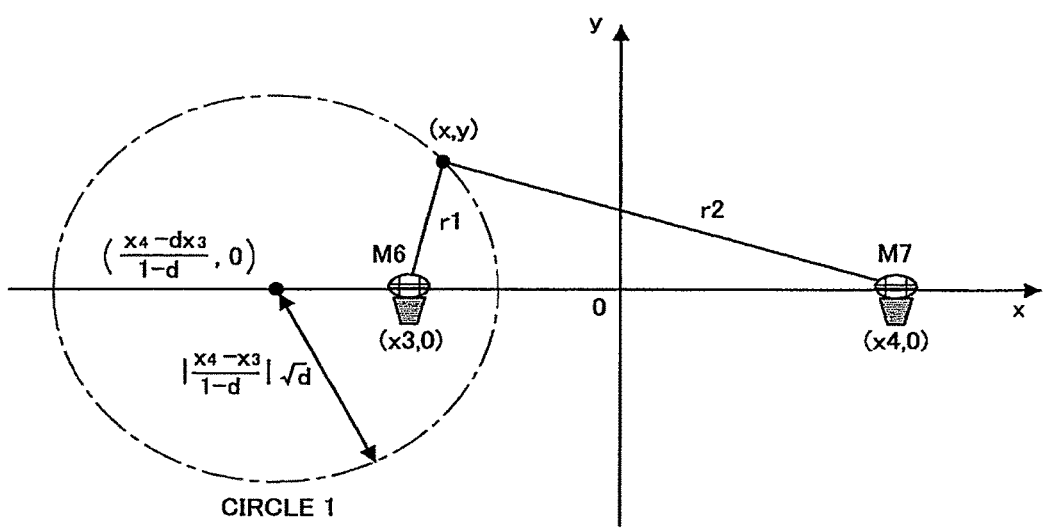
FIG. 7 is an illustration showing the way of estimating a source location of an input sound based on the volume of two input sounds.

FIG. 7 is an illustration showing the way of estimating a source location of an input sound based on the volume of two input sounds. If a sound source is assumed to be a point source, a volume that is measured at a given point is inversely proportional to the square of a distance due to the inverse square law. Assuming a microphone M6 and a microphone M7 which constitute the sound pickup portion 110 as shown in FIG. 7, the set of points where the volume ratio of sounds that respectively reach the microphone M6 and the microphone M7 is constant is represented by a circle. The distance/direction estimator 136 can calculate the volume ratio from a volume value that is input from the volume detector 124 and then calculate the radius and the center of the circle on which the sound source exists.

As shown in FIG. 7, when the microphone M6 is located at (x3, 0), and the microphone M7 is located at (x4, 0) (the generality is maintained with such assumption), if a point on the set of points of a source location to be calculated is (x, y), the distances r1 and r2 from the microphones M6 and M7, respectively, to the sound source are represented as the following expression 5.

$$r_1=\sqrt{(x-x_3)^2+y^2} \quad r_2=\sqrt{(x-x_4)^2+y^2} \quad \text{Expression 5}$$

The following expression 6 is derived because of the inverse square law.

$$\frac{1}{r_1^2} : \frac{1}{r_2^2} = const. \quad \text{Expression 6}$$

The expression 6 can be transformed into the following expression 7 using a positive constant d (e.g. 4).

$$\frac{r_2^2}{r_1^2} = d \quad \text{Expression 7}$$

If the expression 7 is substituted into r1 and r2 and arranged, the following expression 8 is derived.

$$\frac{(x-x_4)^2 + y^2}{(x-x_3)^2 + y^2} = d \quad \text{Expression 8}$$

$$\left(x - \frac{x_4 - dx_3}{1-d}\right)^2 + y^2 = \frac{d(x_4 - x_3)^2}{(1-d)^2}$$

From the expression 8, the distance/direction estimator 136 estimates that the sound source exists on the circle 1 with the center coordinate represented by the expression 9 and the radius represented by the expression 10 as shown in FIG. 7.

$$\left(\frac{x_4 - dx_3}{1-d}, 0\right) \quad \text{Expression 9}$$

$$\left|\frac{x_4 - x_3}{1-d}\right|\sqrt{d} \quad \text{Expression 10}$$

Figure 8:
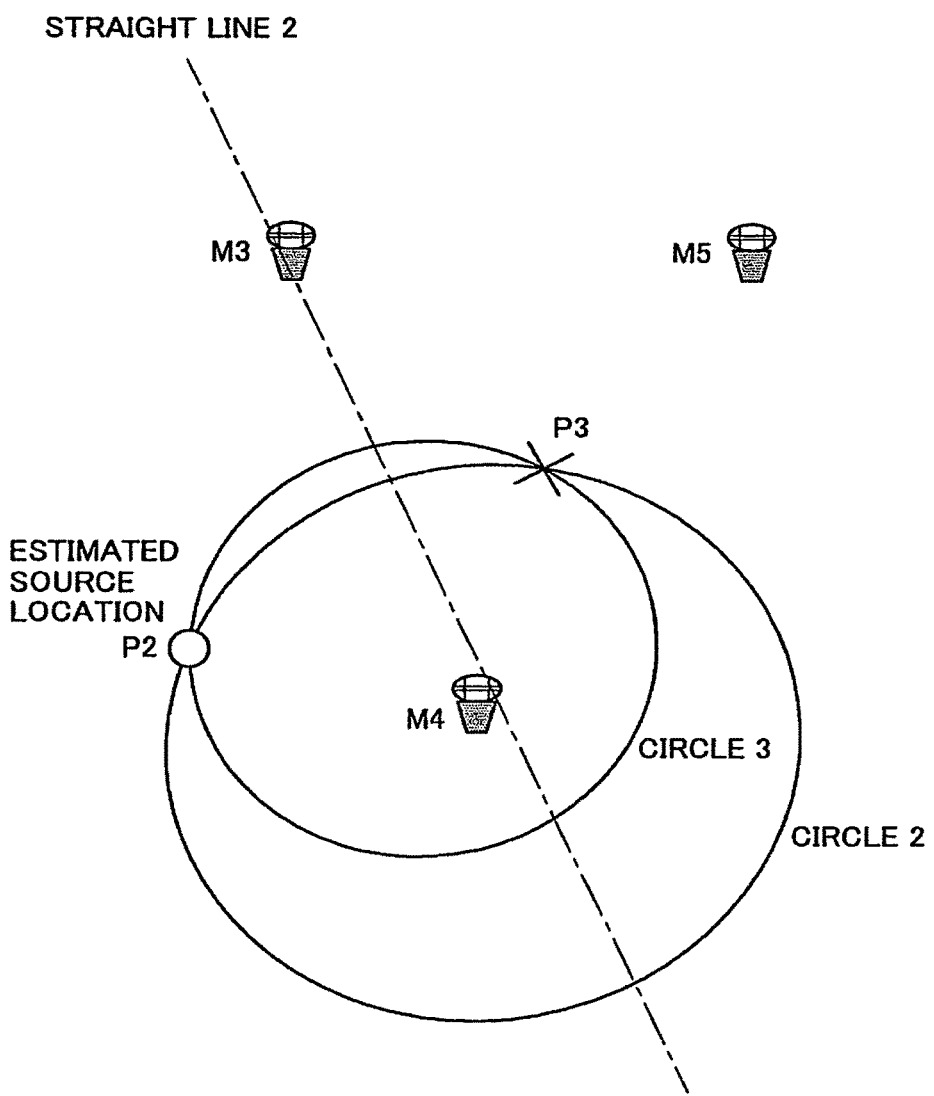
FIG. 8 is an illustration showing the way of estimating a source location of an input sound based on the volume of three input sounds.

FIG. 8 is an illustration showing the way of estimating a source location of an input sound based on the volume of three input sounds. Assuming the arrangement of the microphone M3, the microphone M4 and the microphone M5 which constitute the sound pickup portion 110 as shown in FIG. 8, if the phase of an input sound that reaches the microphone M5 delays compared with the phases of input sounds that reach the microphone M3 and the microphone M4, the distance/direction estimator 136 determines that the sound source is located on the opposite side of the microphone M5 with respect to the straight line 2 which connects the microphone 3 and the microphone 4 (depth determination).

Further, the distance/direction estimator 136 can calculate a circle 2 on which the sound source possibly exists based on the volume ratio of input sounds that respectively reach the microphone M3 and the microphone M4 and also calculates a circle 3 on which the sound source possibly exists based on the volume ratio of input sounds that respectively reach the microphone M4 and the microphone M5. Consequently, the distance/direction estimator 136 can estimate a point P2 of intersection of the circle 2 and the circle 3 as a source location. With the use of four or more microphones, the distance/direction estimator 136 can achieve more accurate estimation including the spatial arrangement of a sound source.

The distance/direction estimator 136 estimates a source location of an input sound based on a phase difference or a volume ratio of input sounds as described above and then outputs direction information and distance information on the estimated source to the operator sound estimator 138. The following table 1 summarizes the inputs and outputs of each element of the volume detection portion 122, the quality detection portion 130 and the distance/direction estimator 136 described above.

TABLE 1

| Block | Input | Output |
| --- | --- | --- |
| Volume detector | Input sound | Volume string (amplitude) in frame |
| Average volume detector | Volume string (amplitude) in frame | Volume average |
| Maximum volume detector | Volume string (amplitude) in frame | Volume maximum value |
| Spectrum detector | Input sound | Spectrum |
| Quality detector | Input sound Volume average Volume maximum value Spectrum | Likelihood of human voice Likelihood of music Stationarity or nonstationarity Impulsivenss |
| Distance/direction estimator | Input sound Volume string (amplitude) in frame Spectrum | Direction information Distance information |

If sounds that are emitted from a plurality of sources are superposed on an input sound, it is difficult for the distance/direction estimator 136 to estimate an accurate source location of a sound that is dominantly included in the input sound. However, the distance/direction estimator 136 can estimate a position close to a source location of a sound that is dominantly included in the input sound. Further, because the estimated source location may be used as a default value for sound separation in the source separation portion 140, the sound recording apparatus 10 can perform a desired operation even if there is an error in the source location that is estimated by the distance/direction estimator 136.

Referring back to FIG. 4, the configuration of the sound determination portion 120 is further described hereinbelow. The operator sound estimator 138 comprehensively determines whether an input sound includes a proximity sound that is emitted from a particular source in close proximity to the sound recording apparatus 10, such as a sound from an operator or a noise caused by the action of an operator, based on at least one of the volume, the quality and the location information of the input sound. The operator sound estimator 138 also serves as a sound determination portion that outputs information indicating that an input sound includes a proximity sound (operator sound existential information), the location information estimated by the distance/direction estimator 136 and so on to the source separation portion 140 when it determines that the input sound includes a proximity sound.

Figure 9:
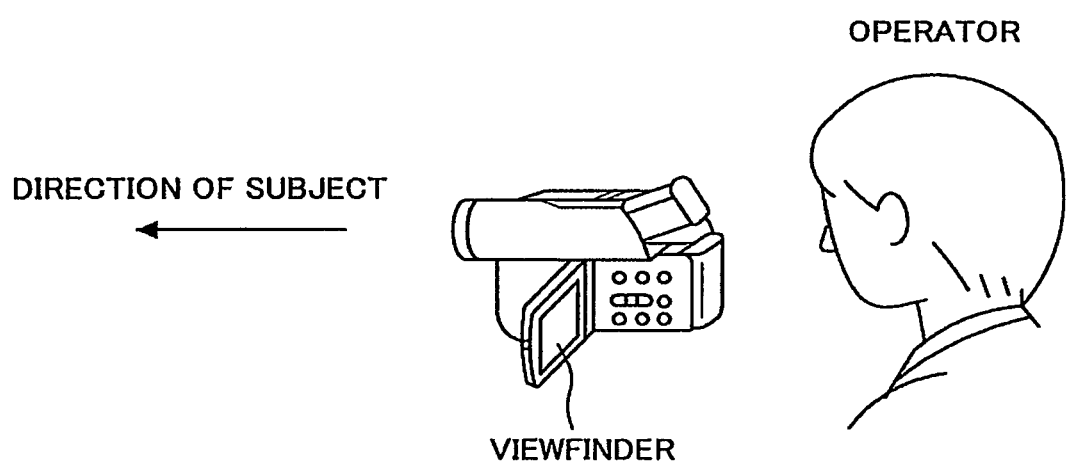
FIG. 9 is an illustration showing the locational relationship between a sound recording apparatus and an operator.

Specifically, the operator sound estimator 138 may determine that an input sound includes a proximity sound when the distance/direction estimator 136 estimates that the source of the input sound is located rearward in a shooting direction of a shooting portion (not shown) that shoots video, and the input sound matches or is close to a human voice. As shown in FIG. 9, an operator manipulates the sound recording apparatus 10 from the rear of the shooting direction of the shooting portion, which is the left rear of a viewfinder in often cases (during normal shooting, not self-shooting, by a right-hander).

Therefore, the operator sound estimator 138 can determine that an input sound dominantly includes an operator's sound as a proximity sound if the source location of the input sound is in the rear of the shooting direction of the shooting portion and the input sound matches or is close to a human voice. It is thereby possible to obtain a mixed sound in which the volume ratio of the operator's sound is reduced by the sound mixing portion 150, which is described later.

Further, the operator sound estimator 138 may determine that an input sound includes a proximity sound that is emitted from a particular source if the source location of the input sound is within a set distance from a sound pickup location (e.g. in close proximity to the sound recording apparatus 10, such as within 1 m from the sound recording apparatus 10), the input sound includes an impulse sound, and the input sound has a higher volume than a past average volume. When an operator of the sound recording apparatus 10 manipulates a button of the sound recording apparatus 10 or changes the way of hand-holding the sound recording apparatus 10, an impulse sound such as snap or bang is likely to occur. Because such an impulse sound is generated in the sound recording apparatus 10, it is likely to be picked up at a relatively high volume.

Therefore, the operator sound estimator 138 can determine that an input sound dominantly includes a noise caused by the action of an operator as a proximity sound if the source location of the input sound is within a set distance from the sound pickup location, the input sound includes an impulse sound, and the input sound has a higher volume than a past average volume. It is thereby possible to obtain a mixed sound in which the volume ratio of the noise due to the action of an operator is reduced by the sound mixing portion 150, which is described later.

The following table 2 summarizes an example of information that are input to the operator sound estimator 138 and determination results by the operator sound estimator 138. It is possible to enhance the accuracy of the determination in the operator sound estimator 138 by using a proximity sensor, a temperature sensor or the like in combination.

TABLE 2

| | Volume | | Quality | | | | Direction and Distance | | Determination |
|---|---|---|---|---|---|---|---|---|---|
| Volume | Average volume | Maximum volume | Likelihood of human voice | Likelihood of music | Stationarity or Nonstationarity | Impulsiveness | Direction | Distance | result |
| High | Higher than past average volume | High | High | Low | Nonstationarity | Medium | Rearward | Close | Operator sound |
| High | Higher than past average volume | High | Low | Low | Nonstationarity | High | All directions | Close | Operating noise |
| Low | Lower than past average volume | Low | Medium | Medium | Stationarity | Low | Unclear | Far | Stationary ambient sound |
| Low | Relatively lower than past average volume | Medium | Low | Low | Nonstationarity | High | All directions | Far | Impulsive ambient sound |
| Medium | Relatively higher than past average volume | Medium to High | Medium | Medium | Nonstationarity | Medium | Forward | Close to Far | Subject sound |

Referring back to FIG. 3, the configuration of the sound recording apparatus 10 is further described hereinbelow. When the source separation portion 140 receives operator sound existential information from the sound determination portion 120, it separates the input sound that is input from the sound pickup portion 110 into a proximity sound such as an operator sound and a pickup target sound (second sound) such as a subject sound which is other than the proximity sound based on location information of a sound source that is input from the sound determination portion 120. Accordingly, the source separation portion 140 outputs double the number of the input sound. FIG. 3 shows an example where the source separation portion 140 receives a left sound L and a right sound R as an input sound, outputs a left proximity sound L1 and a right proximity sound R1 as a proximity sound, and further outputs a left pickup target sound L2 and a right pickup target sound R2 as a pickup target sound.

Specifically, the source separation portion 140 serves as a sound separation portion that separates a sound according to a source with the use of a technique of using ICA (Independent Component Analysis), a technique of using a small overlap between time-frequency components of sounds and so on.

The sound mixing portion 150 mixes the proximity sound and the pickup target sound that are input from the source separation portion 140 in such a way that the volume ratio of the proximity sound in a mixed sound is lower than the volume ratio of the proximity sound in the input sound. In this configuration, when the volume of the proximity sound that is emitted from a particular source is undesirably high in the input sound, the sound mixing portion 150 can generate a mixed sound having the volume ratio of the pickup target sound that is higher than the volume ratio of the pickup target sound in the input sound. The sound recording apparatus 10 can thereby prevent the pickup target sound from being improperly buried in the proximity sound.

The sound mixing portion 150 mixes the left proximity sound L1 and the left pickup target sound L2 to generate a mixed left sound L, and mixes the right proximity sound R1 and the right pickup target sound R2 to generate a mixed right sound R. The sound mixing portion 150 then outputs the mixed left sound L and the mixed right sound R as mixed sounds to the recording portion 160.

The sound mixing portion 150 may calculate an appropriate mixture ratio from an average volume ratio of the proximity sound and the pickup target sound which are separated by the source separation portion 140 and mix the proximity sound and the pickup target sound at the calculated mixture ratio. Further, the sound mixing portion 150 may vary a mixture ratio to be used in each frame within a range that a difference in mixture ratio between a current frame and a previous frame does not exceed a predetermined limit.

The recording portion 160 records the mixed sound that is input from the sound mixing portion 150 into the storage portion 170. The storage portion 170 may be nonvolatile memory such as EEPROM (Electrically Erasable Programmable Read-Only Memory) and EPROM (Erasable Programmable Read-Only Memory), magnetic disks such as hard disk and discoid magnetic disk, optical discs such as CD-R (Compact Disc Recordable)/RW (ReWritable), DVD-R (Digital Versatile Disc Recordable)/RW/+R/+RW/ RAM(Random Access Memory) and BD (Blu-ray Disc (registered trademark))-R/BD-RE, or memory such as MO (Magneto Optical) disk. The storage portion 170 may also store video data of a subject.

As described above, in the sound recording apparatus 10 of this embodiment, the recording portion 160 records the mixed sound with the volume ratio of the proximity sound being lower than the volume ratio of the proximity sound in the input sound into the storage portion 170. This allows a playback apparatus to play back the mixed sound in which the volume ratio of the proximity sound is adjusted appropriately without the need for installing a special volume correcting function to the playback apparatus.

Figure 10:
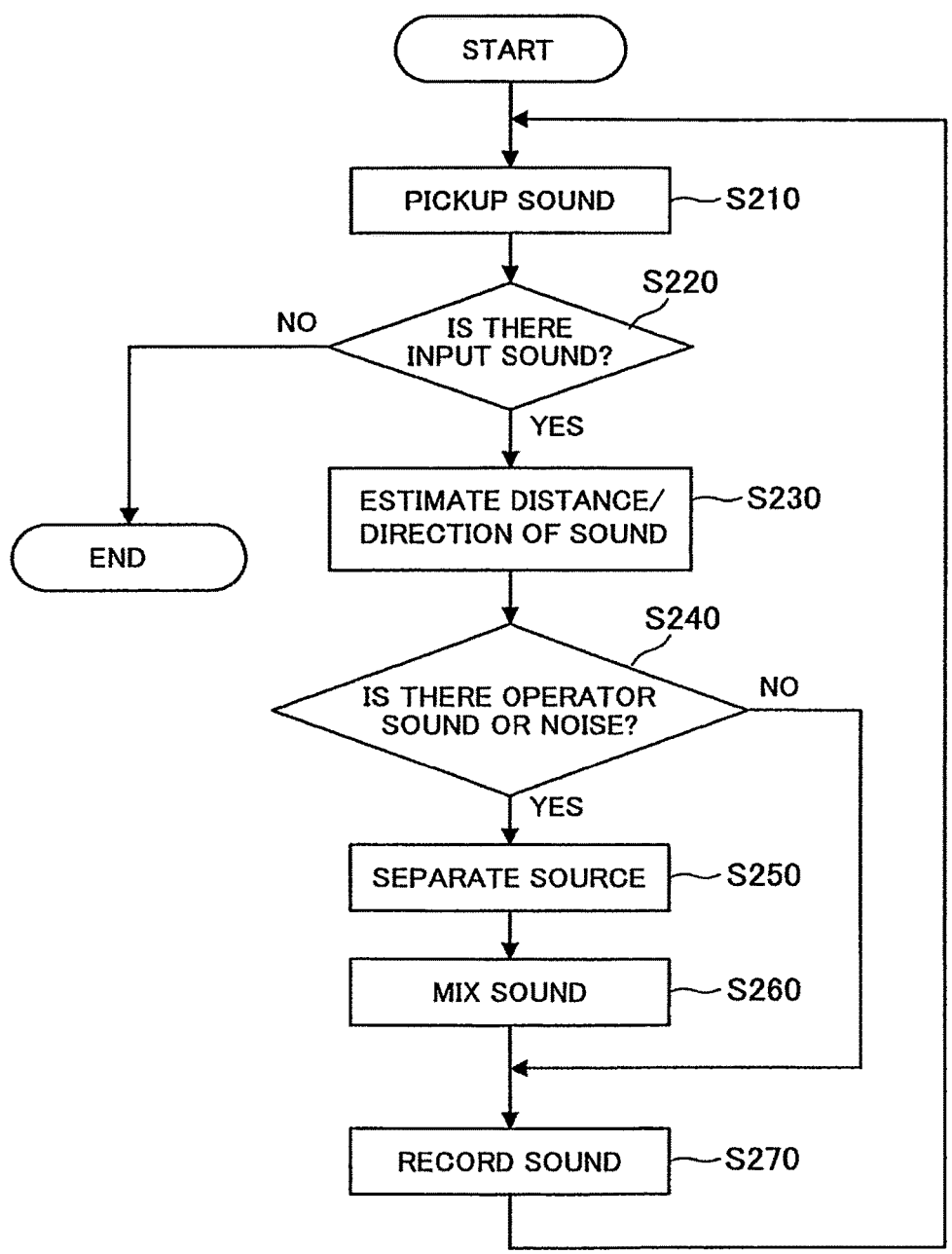
FIG. 10 is a flowchart showing the flow of a sound processing method that is performed in the sound recording apparatus according to the first embodiment of the present invention.

The configuration of the sound recording apparatus 10 according to this embodiment is described in the foregoing. Referring now to FIG. 10, a sound processing method that is executed in the sound recording apparatus 10 of this embodiment is described hereinafter.

FIG. 10 is a flowchart showing the flow of the sound processing method that is performed in the sound recording apparatus 10 according to this embodiment. In the sound recording apparatus 10, the sound pickup portion 110 first picks up a sound (S210). If there is no input sound, the process ends. If, on the other hand, there is an input sound, the distance/direction estimator 136 estimates location information such as the distance or the direction of a source from which the whole or a part of the input sound is emitted (S230).

Then, the operator sound estimator 138 determines whether the input sound includes a proximity sound such as a sound emitted from an operator or a noise caused by the action of the operator (S240). If the operator sound estimator 138 determines that the input sound includes the proximity sound, the source separation portion 140 separates the input sound into the proximity sound and a pickup target sound which is other than the proximity sound (S250).

After that, the sound mixing portion 150 mixes the proximity sound and the pickup target sound that are separated by the source separation portion 140 at a prescribed mixture ratio, thereby generating a mixed sound (S260). After the step S260 or when the step S240 determines that the input sound does not include a proximity sound such as a sound emitted from an operator or a noise caused by the action of the operator, the recording portion 160 stores the mixed sound or the input sound into the storage portion 170.

As described above, in the sound recording apparatus 10 of this embodiment, the source separation portion 140 separates a proximity sound that is emitted from a particular source and included in an input sound based on location information of the source of the input sound that is estimated by the distance/direction estimator 136, and the sound mixing portion 150 mixes the proximity sound with a pickup target sound, which is the other sound that is included in the input sound, in such a way that the volume ratio of the proximity sound in a mixed sound is lower than the volume ratio of the proximity sound in the input sound.

Therefore, if the volume of a proximity sound that is emitted from a particular sound is undesirably high in an input sound, the sound mixing portion 150 can generate a mixed sound having the volume ratio of the pickup target sound that is higher than the volume ratio of the pickup target sound in the input sound. Consequently, the sound recording apparatus 10 can suppress the relative volume of the proximity sound to thereby prevent the pickup target sound from being improperly buried in the proximity sound. Further, the sound recording apparatus 10 can record a high-quality mixed sound from which the effect of a proximity sound such as a sound emitted from an operator or a noise that is included in an input sound is reduced or eliminated.

The sound recording apparatus 10 can record a mixed sound with the volume ratio of the proximity sound being lower than the volume ratio of the proximity sound in the input sound. This allows a playback apparatus to play back the mixed sound in which the volume ratio of the proximity sound is adjusted appropriately without the need for installing a special volume correcting function to the playback apparatus.

Further, because the sound recording apparatus 10 of this embodiment can process an input sound by software and record a mixed sound with the adjusted volume ratio of a proximity sound and a pickup target sound, it is possible to reduce a hardware scale such as the number of microphones.

(Second Embodiment)

A sound playback apparatus 11 according to a second embodiment of the present invention is described hereinafter. The sound playback apparatus 11 of this embodiment is capable of playing back a mixed sound in which the volume ratio of a proximity sound that is included in a prestored sound is adjusted. The configuration of the sound playback apparatus 11 is described hereinbelow with reference to FIG. 11.

Figure 11:
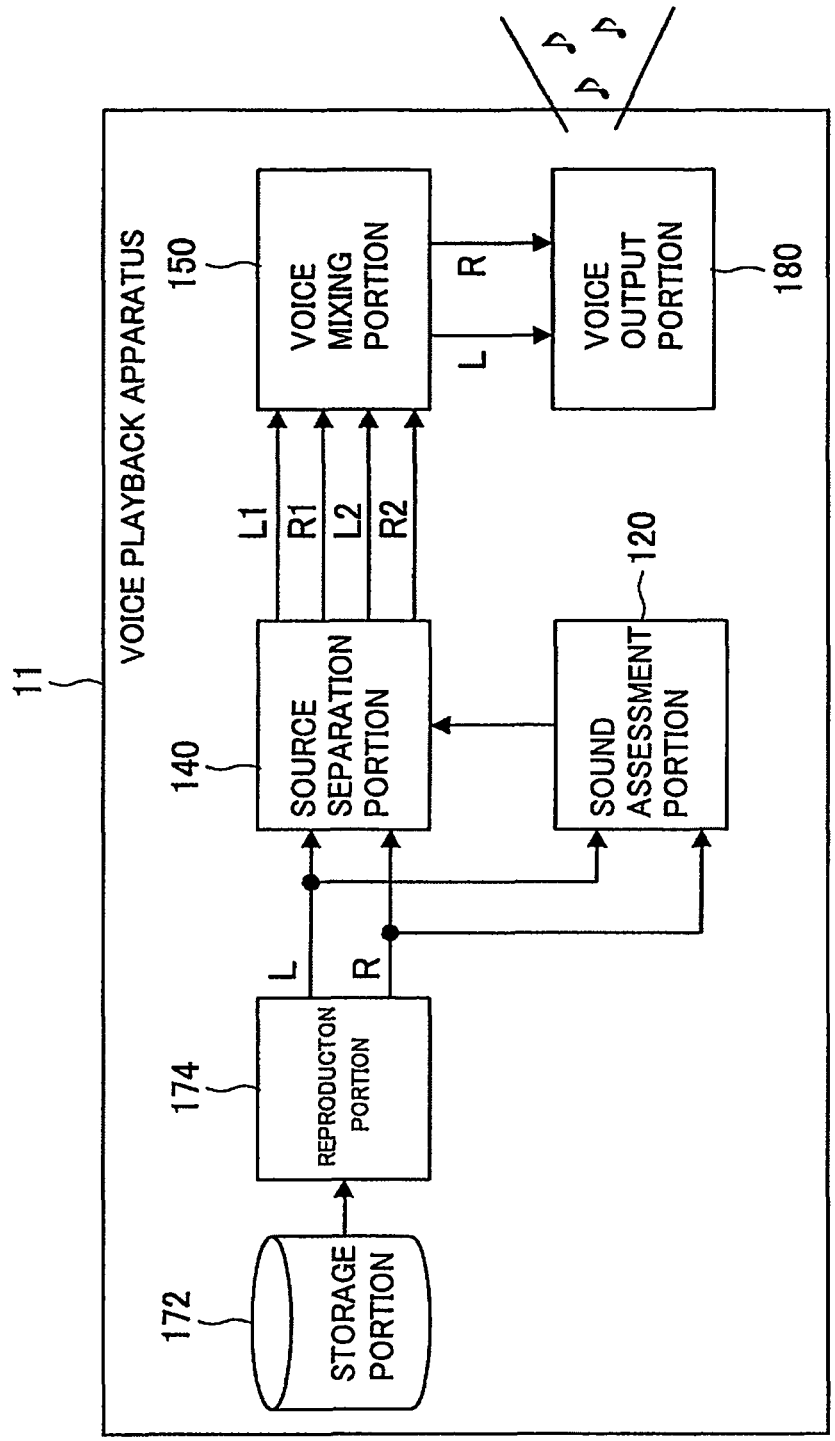
FIG. 11 is a functional block diagram showing the configuration of a sound playback apparatus according to a second embodiment of the present invention.

FIG. 11 is a functional block diagram showing the configuration of the sound playback apparatus 11 according to this embodiment. The sound playback apparatus 11 of this embodiment includes the sound determination portion 120, the source separation portion 140, the sound mixing portion 150, a storage portion 172, a reproduction portion 174 and a sound output portion 180. In the description of this embodiment, the configuration which is substantially the same as the one described in the first embodiment is not repeatedly described, and the configuration which is different from that of the first embodiment is mainly described herein.

The storage portion 172 stores a sound that is recorded in a given apparatus that has a sound recording function. The reproduction portion 174 reads out the sound that is stored in the storage portion 172 and performs decoding thereon according to need. Then, the reproduction portion 174 outputs the sound that is stored in the storage portion 172 to the sound determination portion 120 and the source separation portion 140. The sound determination portion 120 and the source separation portion 140 treat the output from the reproduction portion 174 as an input sound and perform substantially the same processing as those described in the first embodiment.

The sound output portion 180 outputs a mixed sound that is mixed by the sound mixing portion 150. The sound output portion 180 may be a speaker or earphones, for example. Like the storage portion 170 in the first embodiment, the storage portion 172 of this embodiment may also be non-volatile memory such as EEPROM and EPROM, magnetic disks such as hard disk and discoid magnetic disk, optical discs such as CD-R/RW, DVD-R/RW/+R/+RW/RAM and BD (Blu-ray Disc (registered trademark))-R/BD-RE, or memory such as MO (Magneto Optical) disk.

As described above, in the sound playback apparatus 11 of this embodiment, the sound determination portion 120, the source separation portion 140 and the sound mixing portion 150 generate a mixed sound based on an input sound that is input from the reproduction portion 174 and output the mixed sound as a reproduced sound. This enables the playback of the mixed sound in which the volume ratio of the proximity sound is adjusted appropriately without the need for installing a special volume correcting function to a recording apparatus which records an input sound to the storage portion 172. This also enables the output of a high-quality mixed sound from which the effect of a proximity sound such as a sound emitted from an operator or a noise is reduced or eliminated.

(Third Embodiment)

A sound playback apparatus 12 according to a third embodiment of the present invention is described hereinafter. If AGC (Automatic Gain Control) is performed on an input sound, the sound playback apparatus 12 of this embodiment is capable of reversely correcting the volume of a pickup target sound that is included in the input sound and boosting the pickup target sound. The configuration and the operation of the sound playback apparatus 12 of this embodiment are described hereinafter with reference to FIGS. 12 and 13.

Figure 12:
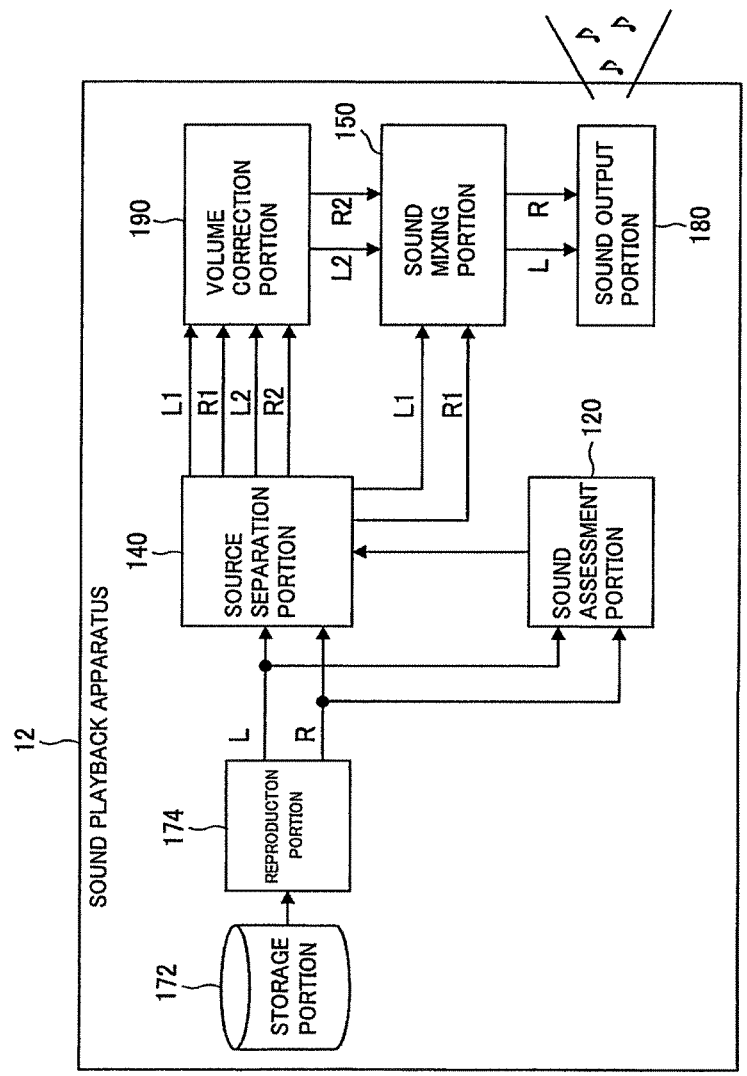
FIG. 12 is a functional block diagram showing the configuration of a sound playback apparatus according to a third embodiment of the present invention.

FIG. 12 is a functional block diagram showing the configuration of the sound playback apparatus 12 according to this embodiment. The sound playback apparatus 12 includes the sound determination portion 120, the source separation portion 140, the sound mixing portion 150, the storage portion 172, the reproduction portion 174, the sound output portion 180, and a volume correction portion 190. In the description of this embodiment, the configuration which is substantially the same as the one described in the second embodiment is not described in detail, and the configuration which is different from that of the second embodiment is mainly described herein.

The storage portion 172 of this embodiment stores a sound on which the AGC (volume correction) is performed partly or entirely. The AGC is a compressor mechanism of which one object is to prevent a clipping noise by automatically reducing a volume level for an excessive volume input. The volume of a sound on which the AGC is implemented is described hereinbelow with reference to FIG. 13.

Figure 13:
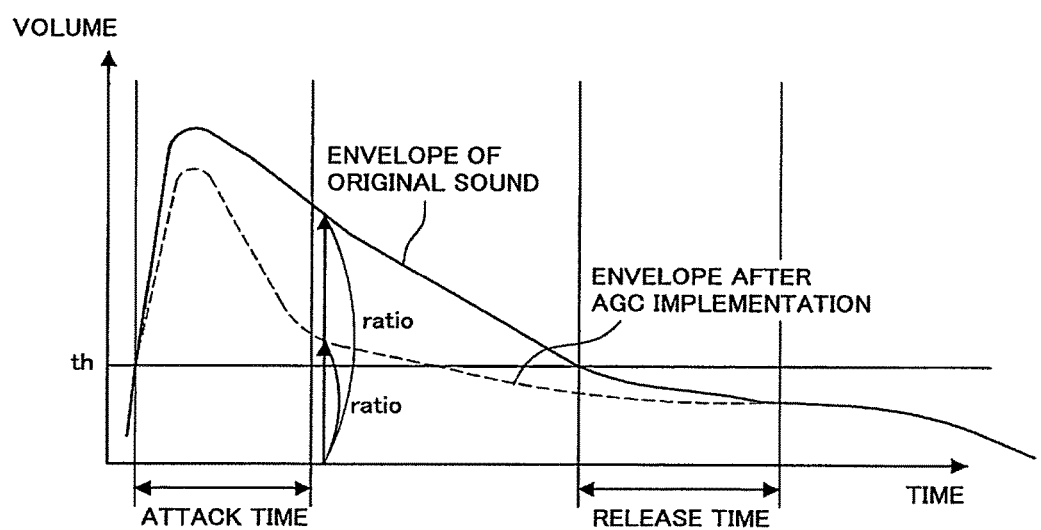
FIG. 13 is an illustration showing the volume of a sound before AGC implementation and the volume of a sound after AGC implementation in contrast with each other.

FIG. 13 is an illustration showing the volume of a sound before AGC implementation (original sound) and the volume of a sound after AGC implementation in a contrasting manner. If the volume of a sound before AGC implementation is higher than a threshold th, the AGC compresses the volume to a prescribed ratio during a time which is set as an attack time. FIG. 13 shows the case where the volume of a sound before AGC implementation is compressed to about 1/2 to 2/3 during a time which is set as an attack time. After that, if the volume of a sound before AGC implementation becomes lower than the threshold th, the AGC is released during a time which is set as a release time.

It is often when an excessive level of a proximity sound is input from the vicinity of a recording apparatus of a sound that the volume of the sound exceeds the threshold th to cause the AGC implementation. Thus, it is not often the case that the AGC is implemented due to a pickup target sound from a distant source. However, because an input sound is entirely compressed by the AGC, not only a proximity sound in the input sound but also a pickup target sound that is originally low level is compressed by the AGC implementation.

In light of the above issue, the sound playback apparatus 12 according to this embodiment has been invented. The sound playback apparatus 12 of this embodiment is capable of boosting a pickup target sound when the AGC is implemented on an input sound with the use of the function of the volume correction portion 190.

The volume correction portion 190 detects an attack time during which the AGC is applied based on a change of the volume of a proximity sound that is separated by the source separation portion 140 and scans a period corresponding to the attack time in a pickup target sound that is separated by separation portion 140. Although the pickup target sound possibly includes a background ambient sound, a sound emitted from a subject and so on, if it includes a background ambient sound only, its volume level is approximately constant. The volume correction portion 190 can therefore determine that the AGC is implemented on the period during which the volume of a pickup target sound changes at a prescribed level or larger.

In such a case, the volume correction portion 190 performs reverse correction that adjusts the volume of a pickup target sound in this period to be substantially equal to the volume in the previous and subsequent periods, thereby boosting the pickup target sound.

If the estimated values of the attack time and the release time and the degree of the reverse correction which is performed by the volume correction portion 190 are stored, they can be effectively used when a pickup target sound includes a sound that is emitted from a subject. Specifically, when a pickup target sound includes a sound that is emitted by a subject, the volume correction portion 190 detects an attack time from a proximity sound and scans a volume value throughout the previous and subsequent periods of the period corresponding to the attack time in the pickup target sound. As a result of the scanning, if the volume value changes at a time width corresponding to the attack time or the release time, the volume correction portion 190 may determine that the AGC is implemented and perform the reverse correction.

The sound mixing portion 150 mixes the pickup target sound of which volume is reversely corrected by the volume correction portion 190 and the proximity sound which is separated by the source separation portion 140 at a volume ratio in which the volume ratio of the proximity sound is suppressed to thereby generate a mixed sound.

As described in the foregoing, if the volume of an input sound is suppressed as a whole and the volume of a pickup target sound is suppressed accordingly due to an excessive volume of a proximity sound, the sound playback apparatus 12 according to the third embodiment of the present invention can increase the volume of the pickup target sound according to the degree of suppressing the input sound volume, thereby preventing the pickup target sound from being too small.

Although the volume correction portion 190 is included in the sound playback apparatus 12 in this embodiment, if the volume correction portion 190 is included in the sound recording apparatus 10 of the first embodiment, it is possible to record a mixed sound which includes a pickup target sound that is boosted according to the degree of the AGC into the storage portion 170 when the AGC is implemented on an input sound.

It should be understood by those skilled in the art that various modifications, combinations, sub-combinations and alterations may occur depending on design requirements and other factors insofar as they are within the scope of the appended claims or the equivalents thereof.

For example, it is not necessary to perform each step in the process of the sound recording apparatus 10 in chronological order according to the sequence shown in the flowchart, and the processing which is performed in parallel or individually (e.g. parallel processing or object processing) may be included.

Further, although FIG. 3, shows the case where the sound determination portion 120 determines whether an input sound that is picked up by the sound pickup portion 110 includes a proximity sound or not, the present invention is not limited to such a case. For example, the sound determination portion 120 may receive a sound that is separated by the source separation portion 140, estimate a source location of the separated sound, determine whether the separated sound includes a proximity sound, and output the separated sound to the sound mixing portion 150. In this case, the source separation portion 140 separates a sound per source blindly without a default value.

Furthermore, it is possible to create a computer program that causes the hardware such as CPU, ROM or RAM which are built in the sound recording apparatus 10, the sound playback apparatus 11 or the sound playback apparatus 12 to perform the equal function to each configuration of the sound recording apparatus 10, the sound playback apparatus 11 or the sound playback apparatus 12. Further, memory that stores such a computer program may be provided. It is also possible to achieve the series of processing on hardware by implementing each functional block that is shown in each functional block diagram of the sound recording apparatus 10, the sound playback apparatus 11 or the sound playback apparatus 12 with hardware.

What is claimed is:

1. A sound processing method, comprising:
   in a sound recording apparatus:
   determining whether an input sound comprising at least a second sound includes a first sound emitted from a particular source, wherein the second sound comprises a sound emitted by a target of a video;
   separating, based on the determination that the input sound includes the first sound, the input sound into the first sound and the second sound emitted from a source different from the particular source;
   executing a reverse correction of a volume of the second sound according to a degree of correction, based on correction being made on a volume of the input sound based on the degree of correction; and
   mixing, based on the determination that the input sound includes the first sound, the first sound and the second sound at a ratio based on the reverse correction executed on the second sound to generate a mixed sound.

2. The sound processing method of claim 1, wherein the mixing of the first sound and the second sound at the ratio suppresses the second sound with respect to the first sound compared to the input sound.

3. The sound processing method of claim 1, wherein the particular source is located within a first distance from a location of at least one sound pickup component of the sound recording apparatus configured to receive the input sound.

4. The sound processing method of claim 3, wherein the first distance is one meter.

5. The sound processing method of claim 1, wherein the first sound includes sound caused by an operator of the sound recording apparatus configured to acquire the input sound.

6. The sound processing method of claim 1, further comprising:
   determining whether the input sound includes the first sound based on at least one of a volume or a quality of the input sound.

7. The sound processing method of claim 6, further comprising:
   determining a location of at least one source based on at least one of the volume or a phase of sound emitted from the at least one source of the input sound; and
   determining that the input sound includes the first sound emitted from the particular source based on the location of the at least one source of the input sound being rearward of a shooting direction of a video-recording portion configured to record the video and the input sound matching a human sound.

8. The sound processing method of claim 1, further comprising:
   determining the input sound includes the first sound emitted from the particular source based on a location of a source of the input sound being within a second distance from the location of at least one sound pickup component of the sound recording apparatus configured to receive the input sound, the input sound includes an impulse sound, and the input sound has a higher volume than a past average volume of the input sound.

9. The sound processing method of claim 1, further comprising:
   recording the input sound; and
   recording into a memory the mixed sound generated by the mixing of the first sound and the second sound.

10. The sound processing method of claim 1, further comprising:
    storing the input sound in a memory; and
    reproducing the input sound stored in the memory.

11. The sound processing method of claim 1, wherein the reverse correction cancels automatic gain control.

12. The sound processing method of claim 1, wherein the ratio comprises a volume ratio.

13. The sound processing method of claim 1, further comprising:
    receiving the input sound from a memory storing at least the input sound.

14. The sound processing method of claim 13, wherein the memory comprises a memory element selected from one of EEPROM, EPROM, magnetic disk memory, optical disc memory, or magneto-optical disc memory.

15. A sound processing method, comprising:
    in a sound recording apparatus:
    receiving an input sound signal;
    determining whether the input sound signal comprises a first sound emitted from a first source and a second sound emitted from a second source at a location nearer to the sound recording apparatus than to the first source, wherein the sound recording apparatus is configured to receive input sound represented by the input sound signal;
    separating, based on the determination that the input sound comprises the first sound and the second sound, the input sound signal into a first sound signal representative of the first sound and a second sound signal representative of the second sound;
    executing a reverse correction of a volume of the second sound according to a degree of correction, based on correction being made on a volume of the input sound based on the degree of correction; and
    mixing, based on the determination that the input sound comprises the first sound and the second sound, the first sound and the second sound at a ratio based on the reverse correction executed on the second sound to generate a mixed sound.

16. The sound processing method of claim 15, further comprising:
    recording the mixed sound into a memory device.

17. The sound processing method of claim 15, further comprising:
    reproducing the input sound signal from a memory device; and
    producing sound from the mixed sound.

18. The sound processing method of claim 17, wherein the memory device comprises a memory element selected from one of EEPROM, EPROM, magnetic disk memory, optical disc memory, or magneto-optical disc memory.

19. The sound processing method of claim 15, wherein determining whether the input sound signal comprises the first sound and the second sound comprises distinguishing the first sound and the second sound based on at least one of spectrum, volume, average volume, maximum volume, distance, direction, or quality.

* * * * *